United States Patent [19]

Nonaka et al.

[11] Patent Number: 4,677,401

[45] Date of Patent: Jun. 30, 1987

[54] NOISE FILTER FOR THREE-PHASE FOUR-WIRE SYSTEM

[75] Inventors: Masami Nonaka; Noboru Kato; Kazuhiro Hibi, all of Shizuoka, Japan

[73] Assignee: Fuji Electrochemical Co., Ltd., Tokyo, Japan

[21] Appl. No.: 755,580

[22] Filed: Jul. 16, 1985

[30] Foreign Application Priority Data

Jul. 19, 1984 [JP] Japan .................. 59-150275

[51] Int. Cl.$^4$ .................. H03H 7/00; H03H 7/09
[52] U.S. Cl. .................. 333/167; 333/177; 333/185
[58] Field of Search .................. 333/167, 169–170, 333/175–177, 181–185, 12; 307/13–14, 11–12

[56] References Cited

U.S. PATENT DOCUMENTS

| 1,387,469 | 8/1921 | Chubb ................. 333/177 |
| 2,938,128 | 5/1960 | Logan ................. 307/14 |
| 3,813,593 | 5/1974 | Tice et al. ............ 333/175 X |

OTHER PUBLICATIONS

"The International Dictionary of Physics and Electronics", D. Van Nostrand Co., New York, 1961; pp. 775–776.

Primary Examiner—Marvin L. Nussbaum
Attorney, Agent, or Firm—Fleit, Jacobson, Cohn & Price

[57] ABSTRACT

A noise filter for an electric wire of star-connected three-phase four-wire system, in which a neutral conductor has a sectional area which is larger than a sectional area of each of voltage conductors. Three voltage conductors are wound on a magnetic core that constitutes a closed magnetic path. The neutral conductor is coupled to the three voltage conductors via three respective capacitors.

1 Claim, 4 Drawing Figures

NOISE FILTER FOR THREE-PHASE FOUR-WIRE SYSTEM

BACKGROUND OF THE INVENTION

The present invention relates to a noise filter, and more particularly to a noise filter for three-phase four-wire system of a star connection.

As is well known in the art, noise filters are connected to a portion of the system where noise is generated or where a power source is connected, or at a desired portion of a conductor between a noise generation source and a protected device, so that the generation and the introduction of the noise is prevented and at the same time an erroneous operation of various devices is prevented. To meet high-frequency requirements and restriction against radiated noise, electronic devices and instruments are provided with noise filters as described above. For example, a large-scale electronic computer generally has an input-line construction in which a single-phase switching power source is connected between the voltage conductor carrying each phase and the neutral conductor, i.e., the electric wires or conductors of the star-connection type three-phase four-wire system. Generally, such a switching power source is provided with, as an input portion, a capacitor-input rectifier smoothing circuit.

The noise filter, utilized with the network of such a star-connection type three-phase four-wire system, is generally constructed with a combination of a common coil device and capacitors, as is similar to a single-phase noise filter. The common coil device has four windings. The voltage conductors of R-phase, S-phase and T-phase and neutral conductor are wound on a magnetic core of closed magnetic circuit, so that common-mode noise is canceled.

In a network of star-connection type, three-phase four-wire system, balanced sine-wave current flow to each phase is combined and, as a result, an electric current does not flow through the neutral conductor. Besides, even if the electric current in each phase is unbalanced, an electric current through the neutral conductor is extremely small since the components of each phase substantially cancel each other to provide such a small current.

In the conventional noise filter for three-phase four-wire system, the neutral conductor is not considered to be a conductor as compared with the R, S and T phase conductors, therefore the neutral conductor had a cross sectional area which is equal to, or smaller than a cross sectional area of those other conductors, and it has been considered that such a wire for the neutral conductor did not provide any disadvantages at all. In order to provide a larger currrent-carrying capacity, conductive wires having a larger diameter are used as at a minimum and as necessary. However, it was considered and widely is believed that the neutral conductor, through which only a small current flows, is preferably made of smaller diameter wire in order to simplify the winding operation and to achieve miniaturization of the magnetic core.

The inventors of the present invention prepared a noise filter having a common coil and capacitors wherein four windings constituting the common coil are made of the same conductive wire material, and the thus formed noise filter was inserted to a network of star-connected three-phase four-wire system, and a single-phase switching power source having a capacitor-input type rectifier circuit as an input portion was connected between the voltage connectors of each phase of the output portion and the neutral conductor, and then operated. Although the device was designed such that it had a sufficient margin for carrying the electric current through the voltage conductor of each phase, the temperature rise of the noise filter exceeded the standard of the filter.

SUMMARY OF THE INVENTION

An object of the present invention is to solve the problems inherent in the conventional art.

Another object of the present invention is to provide an improved noise filter for three-phase four-wire system, which can restrict a temperature rise at the time when a rated current is supplied.

Another object of the present invention is to provide a new noise filter with a remarkable improvement in reliability and safety.

A further object of the present invention is to provide an improved noise filter which is suitable for supplying an electric power to a load through a capacitor-input rectifier circuit.

According to the present invention, there is provided a new noise filter for an electric wire of star-connected three-phase four-wire system, in which a neutral conductor has a crosssectional area which is larger than those of the voltage conductors.

The improved noise filter according to the present invention is the most effective when its output side is connected such that a load is connected between the voltage conductors of each phase and the neutral conductor through a capacitor-input type rectifier circuit, but it may be applied to the other positions without substantial trouble or difficulty. It is preferred that the electric wire for the neutral conductor is selected so that its sectional area is substantially equal to the total area of the other electric wires used as the voltage conductors. Electric wires of the same diameter are generally used for the voltage conductor and, accordingly, the crossectional area of wire for the neutral conductor is selected to be about three times as large as each of the sectional area of the voltage conductor. When choke coils are inserted in the voltage conductors of each phase and in the neutral conductor as a countermeasure against normal mode noise between the conductors, the choke coil for the neutral conductor is selected such that it has a rated current which is three times as large as those of the choke coils for the voltage conductors of each phase.

In the present invention, the neutral conductor has a crosssectional area which is greater than a crosssectional area of each of the other conductors. Accordingly, when a large current, which is the result of the addition of electric currents through the voltage conductors of each phase, is fed through the neutral conductor, the rise in heat of the noise filter can be minimized.

PREFERRED EMBODIMENT OF THE INVENTION

A preferred embodiment of the present invention will be described with reference to the drawings. A noise filter for three-phase four-wire system is formed with the combination of common coil device, capacitors, and choke coil device, as similar as a widely known single-phase noise filter.

Figure 1:
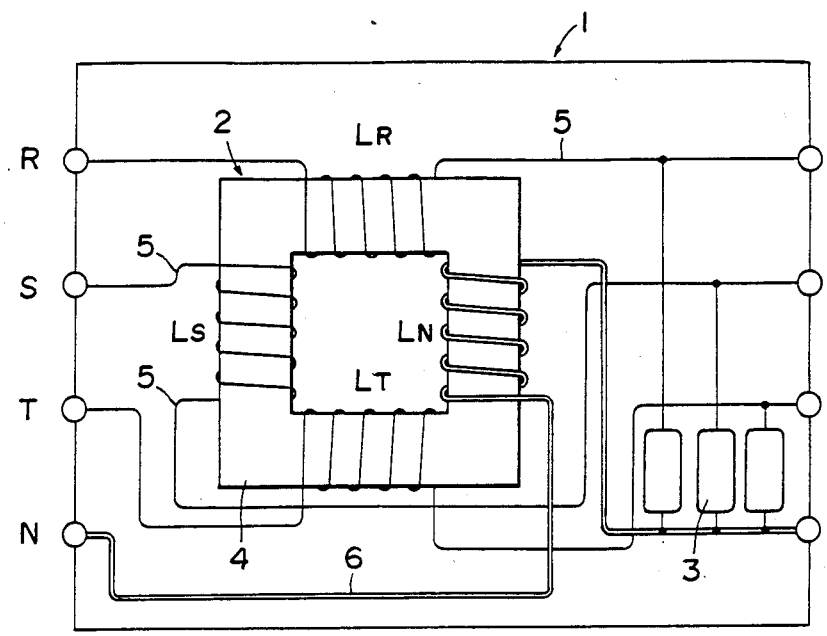
FIG. 1 is an explanatory diagram which shows a noise filter according to an embodiment of the present invention.

Referring first to FIG. 1 which shows a noise filter 1 for three-phase four-wire system, the noise filter has a common coil 2 at an input side thereof, three capacitors connected between a voltage conductor of each phase and a neutral conductor. The common coil 2 is composed of a magnetic core 4 of a closed magnetic circuit and four windings wound around the magnetic core 4. The magnetic core 4 may be a toroidal ferrite core but in order to facilitate winding operation of a conductive wire having a relative large diameter, the magnetic core 4 may be formed with two U-shaped ferrite cores combined together or combination of a U-shaped ferrite core and an I-shaped ferrite core to form a rectangular shape. On three sides of the thus formed rectangular magnetic core 4, conductive wires of the same diameter are wound to provide three voltage conductors 5 of R-phase, S-phase, and T-phase, and a conductive wire having much larger diameter than each of the above-described three voltage conductors is wound around the remaining one side of the magnetic core 4 to provide a neutral conductor. Preferably, the conductive wire for the neutral conductor 6 is selected so that it has crosssectional area which is as large as three times that of each of the aforementioned voltage conductor 5. These windings are wound in the same direction relative to the magnetic core 4.

A basic operational mode of the three-phase four-wire system noise filter is substantially similar to that of a single-phase noise filter which is widely used in that art. Four windings for four phases (R-phase, S-phase, T-phase and N-phase) are wound in the same direction on the magnetic core of a closed magnetic circuit to constitute coils $L_R$, $L_S$, $L_T$ and $L_N$. If an electric current which flows through the voltage conductors at a phase difference of 120° is provided as an input, a magnetic fluxes produced thereby are cancelled with respect to each other, and the magnetic core 4 is not saturated. Besides, even if the electrical currents in the voltage conductors become unbalanced, the differential component thereof flows through the neutral conductor and, accordingly, the magnetic core 4 is not saturated at all. The thus formed common coil functions to exclude common mode noise.

Figure 2:
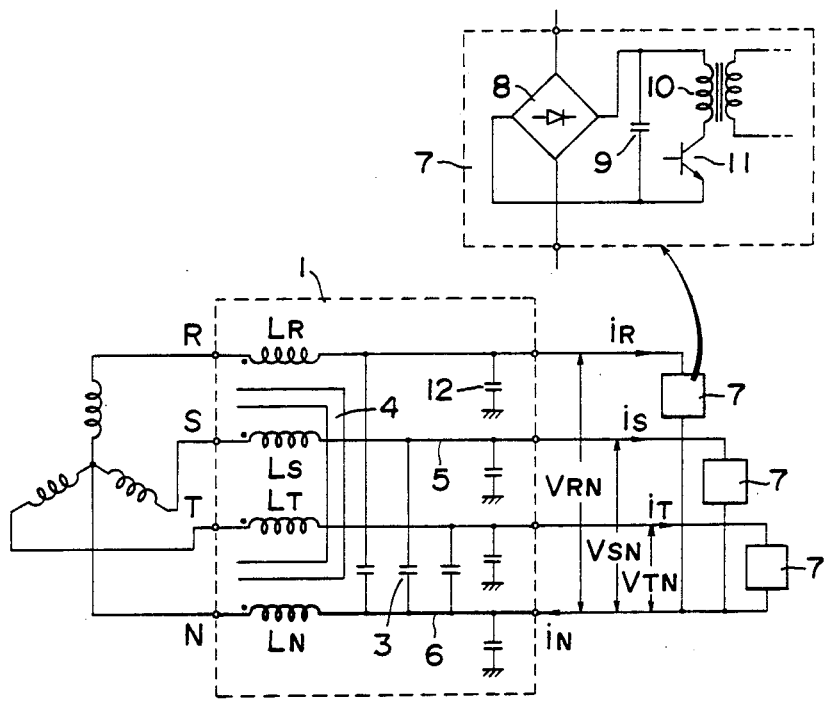
FIG. 2 is a circuit diagram for the noise filter according to the present invention, showing an example of practical use.

FIG. 2 shows an example of an electric circuit to which the noise filter of the present invention is applied. The electric circuit shown has a structure such that an electric power is supplied through a star-connected three-phase four-wire system distribution line, which is connected to respective single switching power supply 7 through the noise filter 1. Each single-phase switching power supply is connected, at the output side of filter 1, between the voltage connector 5 of each phase and the neutral conductor 6. As shown in an enlarged manner in FIG. 2, the single-phase switching power supply 7 has, at its input side, a capacitor-input rectifier circuit. Namely, it has a structure in which AC input is rectified by a diode bridge 8 and smoothed by a smoothing capacitor 9, and the smoothed output is supplied to a serial circuit of a transformer 10 and a switching transistor 11. By the switching operation of the switching transistor 11, electric voltage is induced on the secondary side of the transformer and the electric voltage is utilized as an electric power supply.

Basically the noise filter may have a construction shown in FIG. 1, but in the example of FIG. 2 a capacitor 12 is disposed between the voltage conductor 5 of each phase and the ground and between the neutral conductor 6 and the ground. The neutral conductor has a crosssectional area much larger than the crosssectional area of each of the voltage conductors.

Figure 3:
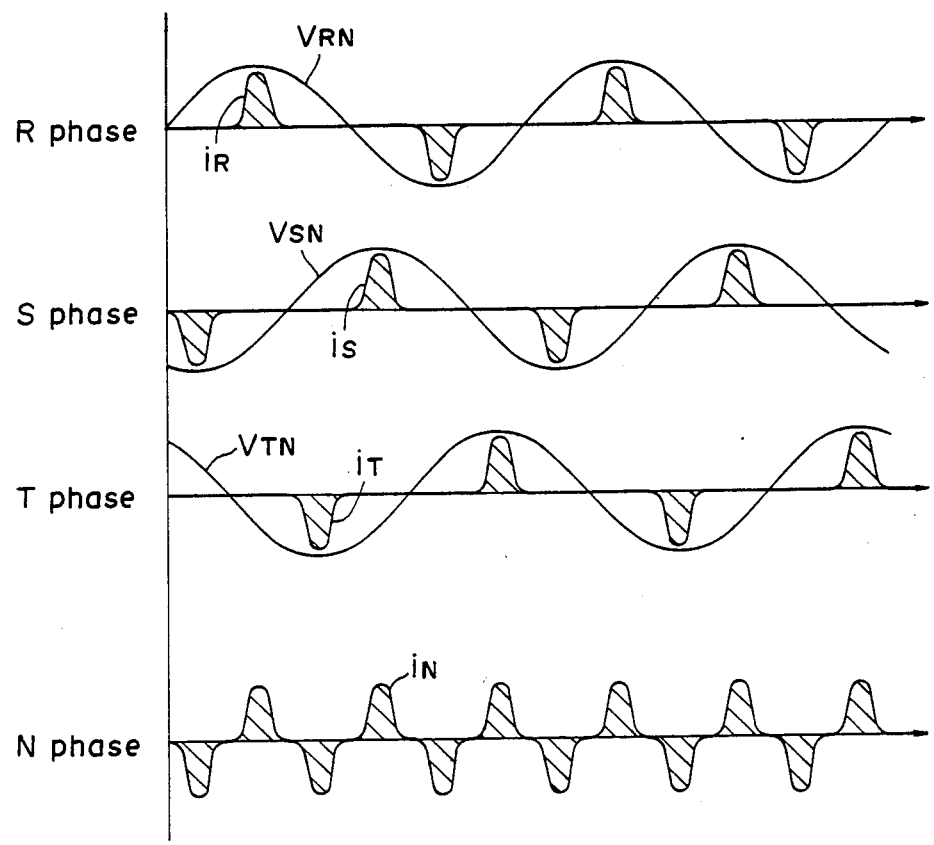
FIG. 3 is an explanatory diagram of voltage and current waveforms of each phase in the circuit shown in FIG. 2.

FIG. 3 shows voltage waveform and current waveform of each phase of the noise filter when a single-phase switching power supply, as described above, is connected between the voltage conductor of each phase and the neutral conductor. Voltage $V_{RN}$ of R-phase, voltage $V_{SN}$ of S-phase, and voltage $V_{TN}$ of T-phase are deviated in phase 120° from each other and are applied to the corresponding switching power supply 7. If the electric currents $i_R$, $i_S$ and $i_T$ are sine-waved shaped (not shown in FIG. 3) and are deviated or out of phase from each other by 120°, the electric current $i_N$ which flows through the neutral conductor is zero. However, in case of the single-phase power supply 7 having a capacitor-input type rectifier circuit as an input portion, electric current of each phase is not formed into a sine-wave shape. When an electric power is supplied to a load, that is, the secondary circuit of the transformer 10, the smoothing capacitor 9 is discharged and, accordingly, the voltage at the terminal of the smoothing capacitor 9 is lowered. By contrast, the electric currents of each phase are fed through the electric line so that the smoothing capacitor 7 is charged. However, the timing of discharge is limited to a very short period which is adjacent to the maximum value of the voltage waveform of each phase since the smoothing capacitor 9 is supplied with charging current after the voltage of each phase is changed into a sine-wave shape and gradually increased to exceed a terminal voltage of the smoothing capacitor 9. Consequently, pulse-like electric currents $i_R$, $i_S$ and $i_T$ are fed at a position adjacent to the peak of the voltage waveform of each phase, as illustrated in FIG. 3. The timing of the currents which flow through the voltage conductors is completely inconsistent with each other and in the worse case shown in FIG. 3, a large current $i_N$, resulting from the addition of absolute values of the phase currents flows through the neutral conductor. According to the present invention, however, the neutral conductor has a larger crosssectional area than each of the voltage conductors and, accordingly, less heat is generated even though a large current is fed therethrough, and the temperature rise of the noise filter is restricted. As will be understood from FIG. 3, an electric current, three times as large as the electric current in the voltage conductor, flows through the neutral conductor in the worst case and, therefore, it is preferable that the neutral conductor has a crosssectional area which is three times as large as that of the other phase conductors.

Figure 4:
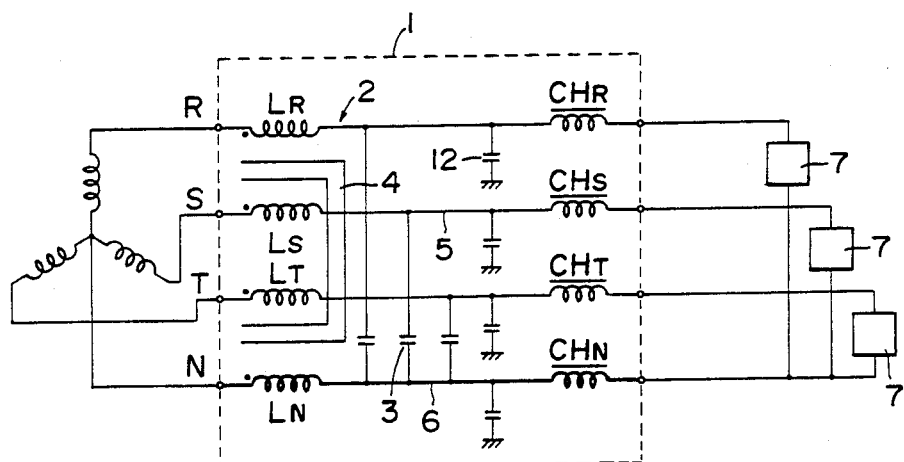
FIG. 4 is a circuit diagram of the noise filter according to the present invention, showing an another example of practical use.

FIG. 4 is a circuit diagram showing an another example to which the noise filter according to the invention is applied. In FIG. 4, the basic structure is substantially similar to that illustrated in FIG. 2, and same reference numerals represent same or similar elements. Hence, their explanations are omitted for simplification only. In the embodiment shown in FIG. 4, choke coils $CH_R$, $CH_S$, $CH_T$ and $CH_N$ are inserted into each phase. In order to exclude a so-called normal-mode noise which is generated between the electric lines, a choke coil is generally installed at each electric lines. In such a case as described, a choke coil $CH_N$ which is installed the neutral conductor is selected such that it has a much greater rated current than that of the other choke coils $CH_R$, $CH_S$ and $CH_T$ of the voltage conductors 5. Preferably the choke coil $CH_N$ has a rated current that is three times as large as the rated current of the other choke coils of the voltage conductors 5. Of course, the neutral conductor 6 of the common coil 2 has a greater crosssectional area than the other voltage conductors, as similar to the previous embodiment. As described previously, a large current, which is three times as large as the electric current flowing through the voltage conductors in the worst case, flows through the neutral conductor if the load condition in each phase is substantially equivalent. In the circuit structure of FIG. 4, heat generation is limited to a minimum even if a large current, which would be three times as large as that of the voltage conductor, is fed through the neutral conductor and the choke coil $CH_N$ is not saturated and, therefore, normal mode noise and common mode noise are cancelled effectively.

According to the present invention, heat generation in the neutral conductor is kept to a minimum and the temperature rise at the time of rated current flow is restricted and provides a reliability and safety factor for various kinds of electronic instruments and devices to which the filter of the present invention is applied.

Although the present invention has been described with reference to the preferred embodiments thereof, many modifications and alterations can be made within the spirit of the present invention.

What is claimed is:

1. A noise filter for a star-connected three-phase four-wire system comprising:
   a common coil having a magnetic core which constitutes a closed magnetic path, wherein said common coil comprises:
   three voltage conductors wound on said magnetic core to provide R, S and T-phases,
   a neutral conductor for providing an N-phase, and
   three capacitors connected between said neutral conductor and each of said voltage conductors, and
   wherein said neutral conductor has a sectional area which is about three times as large as a sectional area of each of said voltage conductors.

* * * * *